(12) United States Patent  
Thomas

(10) Patent No.: US 6,590,265 B2
(45) Date of Patent: Jul. 8, 2003

(54) SEMICONDUCTOR DEVICE WITH SIDEWALL SPACERS HAVING MINIMIZED AREA CONTACTS

(75) Inventor: Michael E. Thomas, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/931,777

(22) Filed: Aug. 16, 2001

(65) Prior Publication Data

US 2002/0006721 A1 Jan. 17, 2002

Related U.S. Application Data

(62) Division of application No. 09/022,596, filed on Feb. 12, 1998, now abandoned.

(51) Int. Cl.[7] .................. H01L 29/76; H01L 29/94; H01L 31/062; H01L 31/113; H01L 31/119
(52) U.S. Cl. .................. 257/369; 257/382; 257/900
(58) Field of Search .................. 438/230, 233, 438/301, 303; 257/334, 336, 337, 338, 368, 369, 382, 900

(56) References Cited

U.S. PATENT DOCUMENTS

| 5,321,211 A | * | 6/1994 | Haslam et al. ............... 174/255 |
| 5,811,350 A | * | 9/1998 | Dennison .................... 438/597 |
| 5,858,848 A | * | 1/1999 | Gardner et al. ............. 438/275 |
| 6,037,232 A | * | 3/2000 | Wieczorek et al. ......... 257/382 |
| 6,093,629 A | * | 7/2000 | Chen .......................... 438/199 |

* cited by examiner

Primary Examiner—Wael Fahmy, Jr.
Assistant Examiner—Hoai Pham
(74) Attorney, Agent, or Firm—Ronald J. Meetin

(57) ABSTRACT

A contact opening (940) is provided in a dielectric layer (720) overlaying a gate electrode (840). The contact opening and gate electrode are of substantially the same width, thus allowing for minimized area contact. A pair of process buffering regions (810) situated along the sidewalls of the gate electrode furnish additional landing area for the contact opening without exposing the sidewalls of the gate electrode.

5 Claims, 3 Drawing Sheets

SEMICONDUCTOR DEVICE WITH SIDEWALL SPACERS HAVING MINIMIZED AREA CONTACTS

CROSS REFERENCE TO RELATED APPLICATION

This is a division of U.S. patent application Ser. No. 09/022,596, filed Feb. 12, 1998, now abandoned.

BACKGROUND

1. Field of the Invention

This invention relates to semiconductor integrated circuits (ICs) and methods of fabrication thereof, and more specifically to a semiconductor IC with minimized dimensions for contact openings and methods for the fabrication of thereof.

2. Related Art

The ability to scale the size of semiconductor device geometries downward is key to meeting the demands for integrated circuits having increased functionality and performance while maintaining low fabrication costs. The industry's ability to meet this demand to date has very much been due to improvements in the optical resolution of photolithography equipment and associated processes. However, the full impact of these improvements is often not realized, as process buffering regions are needed to account for registration and other process tolerances. This is particularly true for contact openings.

For example, in the manner of the prior art, FIG. 1A depicts a plan view of a first contact opening 40 formed overlying a first conductive trace 30. Typically, both first trace 30 and first contact opening 40 are formed having a minimum design dimension. Thus, first trace 30 has a width 50 and first contact 40 a width 52 that are essentially equal. However, to ensure that first contact 40 overlies only first trace 30, contact 40 is positioned within a contact region 34, an expanded region of trace 30, that has a dimension 54, larger than widths 50 and 52. The size difference between width 54 and width 50 is the amount of process buffering required to form first contact 40 entirely overlying conductive trace 30. Therefore despite less than perfect alignment of first opening 40 to first trace 30, as depicted, contact opening 40 is fully within contact region 34. Where a second conductive trace 32 does not provide any process buffering region, that is no region analogous to expanded region 34, the less than perfect alignment of a second contact opening 42 to second trace 32 results in second contact opening 42 being positioned having a portion of second contact 42 off second trace 34, as depicted. As known, such mispositioning can result in both yield and reliability problems. Thus to avoid these problems, prior art processing provides process buffering regions.

Expanded process buffering regions, such as contact region 34, are not the only forms of process buffering regions employed in the prior art. Turning now to FIG. 1B, a plan view of an MOS transistor 90 is shown. An active area 80 has source and drain (S/D) regions 60 formed therein. S/D regions 60 are respectively electrically contacted through S/D contact openings 62. A gate electrode 70 is disposed adjacent to and between S/D regions 62 and overlying a channel region (not shown) in active area 80 bordered by S/D regions 60. Electrical contact to gate electrode 70 is made through a gate contact opening 72 within a process buffering region 74 extending outward from area 80, as depicted. As known, an extended process buffering region, such as region 74, is often employed in prior art MOS transistors for providing electrical contact to gate electrode 70.

Use of an expanded buffering region, such as region 34 of FIG. 1A, is problematic as such an expanded region increases gate length. As known, an increased gate length will result in a change in the electrical characteristics of transistor 90 from that of a transistor having the nominal gate length. On the other hand, failure to use any process buffering region, as shown for second contact 42 in FIG. 1A, can result in lowered yield and reliability due to electrical shorting of gate 70 to S/D regions 60. Therefore the prior art process and MOS transistors formed thereby, require that an extension of gate 70 be employed to form process buffering region 74 and that gate contact opening 72 be disposed within extended region 74. Hence it can be seen that contacts formed in the manner of the prior art require either expanded process buffering regions or extended process buffering regions. These buffering regions require substrate surface area in excess of that required by the functional structures themselves, for example trace 32 and contact 42 of FIG. 1A. Thus, processing in the manner of the prior art does not allow for the full realization of the benefits that downward scaling of device structures can provide.

Thus it would be advantageous to have IC structures and devices that realize the full benefit of scaling the size of such structures and devices downward, and the methods of manufacture thereof. It would also be advantageous to have methods for forming such fully realized size scaled devices and structures that do not require additional photomasking processes. In addition it would be advantageous for such methods of manufacture to be broadly applicable, thus providing for the manufacture of both MOS and Bipolar devices as well as any combination of such devices thereof that fully realize such size scaling. Finally, it would be advantageous to manufacture such fully realized size scaled devices in a cost effective manner so that they have yield and reliability at least equal to that of the prior art.

SUMMARY

In accordance with the present invention, methods for forming minimized area contact structures, and the structures and IC's formed thereby, are provided. In some embodiments of the present invention, MOS integrated circuits and circuit elements are formed. In some embodiments of the present invention, bipolar integrated circuits and circuit elements are formed and in some embodiments, both MOS and bipolar circuit elements and circuit elements are formed.

In accordance with the present invention some embodiments employ a non-conductive material to form process buffering regions adjacent conductive traces. In some embodiments the non-conductive material employed is a dielectric material such as silicon oxide, silicon nitride or a combination of silicon oxide and silicon nitride. In some embodiments both silicon oxide and silicon nitride materials are employed. In some embodiments of the present invention the dielectric material is formed as a layer overlying a semiconductor substrate and selectively etched to form process buffering regions or process buffering spacers adjacent sidewalls of the conductive traces formed on the substrate. In some embodiments process buffering spacers are formed using more than one layer of dielectric material.

Embodiments in accordance with the present invention typically employ a dielectric layer disposed over the process buffering regions. In some embodiments, the material of the process buffering regions is selectively etchable with respect to the dielectric layer. In some embodiments the dielectric layer is formed of more than one layer of dielectric material, each layer being selectively etchable with respect to an underlying layer. In some embodiments of the present invention contact holes or vias are formed by etching portions of the dielectric layer left exposed after deposition and patterning of a photomasking layer to define such portions. In embodiments where a conductive trace is a gate electrode, process buffering regions formed in accordance with the present invention allow direct contact to be made to the gate electrode, if desired. Finally, in some embodiments, the process buffering regions formed, prevent exposure of sidewalls of the conductive traces. In this manner, embodiments in accordance with the present invention avoid the need for formation of either expanded or extended process buffering regions, thus enabling minimized area contacts.

BRIEF DESCRIPTION OF THE DRAWINGS

The present invention may be better understood, and its numerous objects, features, and advantages made apparent to those skilled in the art by referencing the accompanying drawings. For ease of understanding and simplicity, where elements are common between illustrations, common numbering of those elements is employed between illustrations.

DETAILED DESCRIPTION

As embodiments of the present invention are described with reference to the drawings, various modifications or adaptations of the specific methods and or structures may become apparent to those skilled in the art. All such modifications, adaptations or variations that rely upon the teachings of the present invention, and through which these teachings have advanced the art, are considered to be within the spirit and scope of the present invention. For example, in some embodiments of the present invention, process buffering spacers are formed after removal of sidewall spacers used for, among other things, formation of silicide regions.

FIGS. 2A–2E depict a series of stages in the fabrication of an embodiment in accordance with the present invention. As shown, in each of FIGS. 2D and 2E, a first portion and a second portion of the embodiment are depicted. The first portion, on the left, illustrates an embodiment of the invention having a slight mis-alignment, as was seen with respect to the prior art conductive trace 30 and contact 40 in FIG. 1A. The second portion, on the right, illustrates an embodiment of the invention having less than perfect alignment as was seen with respect to the prior art conductive trace 32 and contact 42, also in FIG. 1A.

Figure 2A:
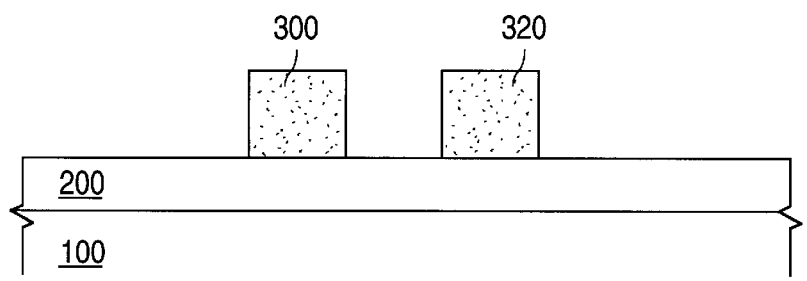
FIGS. 2A–2E are cross-sectional representations of stages in the formation of contact regions on conductive traces in accordance with an embodiment of the present invention.

Turning to FIG. 2A, a semiconductor substrate or wafer 100 is shown having a conductive layer 200 disposed thereon. While wafer 100 is depicted as having a minimum of complexity, other types of substrates or wafers may be advantageously employed. For example, substrate 100 can be an N-type or P-type substrate, or can be an N-type or P-type substrate encompassing N and/or P-type well regions (not shown) and/or an epitaxial layer (not shown). Alternatively, wafer 100 can encompass a silicon on insulator (SOI) structure, or any other appropriate semiconductor substrate material or structure. In addition, in some embodiments in accordance with the present invention, substrate 100 encompasses a dielectric layer (not shown) formed on an upper surface and disposed underlying layer 200. Two masking portions 300 and 320 are depicted overlying predetermined portions of conductive layer 200. Typically, masking portions 300 and 320 are a photoresist material formed by well known photolithographic processes, although other appropriate materials can be employed in addition to or in place of photoresist.

Conductive layer 200 is any of the commonly employed conductive materials or combination of such materials used to form conductive paths or traces for IC's. For example, in some embodiments layer 200 can encompass aluminum, copper or an alloy of aluminum and/or copper. Layer 200 can also encompass more than one layer of conductive material, for example, a conductive barrier layer such as tungsten or a tungsten alloy overlaid with an aluminum layer. In some embodiments layer 200 can also encompass a polysilicon material, an amorphous silicon material or any combination of amorphous and polysilicon doped with an N or P-type dopant. In some embodiments of the present invention, where layer 200 is a polysilicon layer formed adjacent substrate 100, layer 200 is a first conductive layer of an IC having multiple conductive layers. In some embodiments, where layer 200 is an aluminum alloy layer, layer 200 is one conductive metal layer of an IC having a multilayer metal structure. In some embodiments, layer 200 is employed to form a silicon or metal gate electrode (not shown). Therefore it will be understood that the representation of layer 200 in FIG. 2B and the structures of FIGS. 2A–2E are all depicted in their simplest form for illustrative purposes only, and that embodiments of the present invention have a wide range of specific application.

Figure 2B:
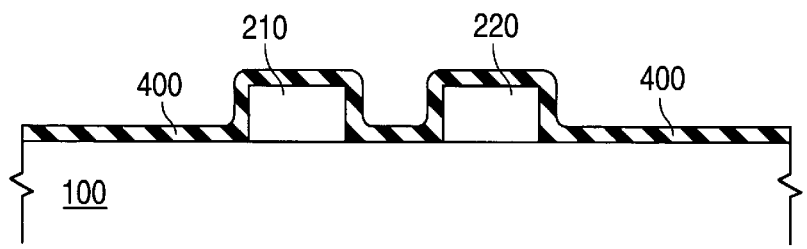

Referring to FIG. 2B, conductive layer 200 (FIG. 2A) is etched to form conductive paths or traces 210 and 220, and masking portions 300 and 320 (FIG. 2A) are subsequently removed. After removal of portions 300 and 320, an essentially conformal layer 400 of a dielectric material is formed overlying substrate 100 and conductive traces 210 and 220. In some embodiments of the present invention, layer 400 encompasses silicon oxide, silicon nitride or any combination of silicon oxide and silicon nitride, although other appropriate materials can be employed.

Figure 2C:
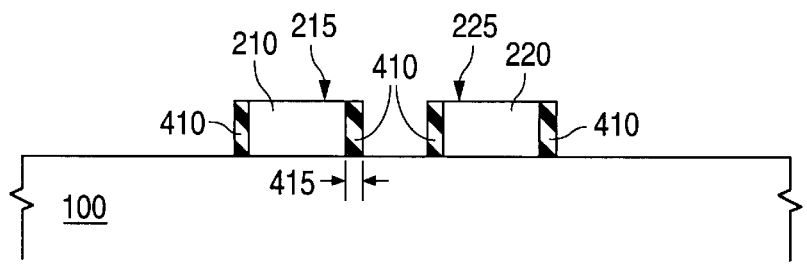

Turning now to FIG. 2C, the structure of FIG. 2B is shown subsequent to forming process buffering areas or spacers 410. As depicted, process buffering spacers 410 are formed adjacent sidewalls of conductive traces 210 and 220, and have a predetermined width 415. It will be understood that width 415 defines the amount of process buffering that an embodiment in accordance with the present invention provides. Thus, with knowledge of the process capabilities of the various processes for which such process buffering is needed, width 415 is determined to be the sum of the buffering required for each of the various processes. For example, where a photolithography process requires 0.1 micron ($\mu$m) of buffering and is followed by an etch process also requiring 0.1 $\mu$m of process buffering, width 415 is the sum of these two processes, 0.2 $\mu$m. It will be understood that while the magnitude of width 415 needed by a specific application is determined by the amount of process buffering required, width 415 is set by the thickness of layer 400 (FIG. 2B) as formed. Thus, for a 0.2 $\mu$m width 415, layer 400 is formed having a thickness of at least 0.2 $\mu$m. Where more or less process buffering is required, layer 400 is formed with a greater or lesser thickness, respectively. Thus the thickness of layer 400, as deposited, will vary in accordance with the nature of the specific application for which an embodiment of the present invention is employed.

Typically, process buffering areas 410 are formed using an anisotropic etch process appropriate for the material from which layer 400 (FIG. 2B) is formed. As one having ordinary skill in the art will know, the specific etch process selected will be selective to the material employed for conductive traces 210 and 220 as well as any underlying dielectric layer (not shown). In this manner, spacers 410 are formed adjacent sidewalls of each trace 210 or 220 while an upper surface 215 or 225 of each trace, respectively, is exposed. For example, where conductive traces 210 and 220 are doped polysilicon traces overlying a substrate 100 having an upper surface formed of a silicon oxide dielectric layer (not shown) and layer 400 (FIG. 2B) is selected to be a silicon nitride material, process buffering spacers 410 are formed employing an etch process that preferentially etches silicon nitride. For example, a reactive ion etch (RIE) process employing a mixture of $CHF_3/O_2$ and $C_2HF_5$ at an appropriate power and pressure has been found to be effective, although other etch process can also be employed. It will be understood that the etch process of this embodiment of the present invention is only provided for illustrative purposes and other etch processes can be employed where appropriate.

Figure 2D:
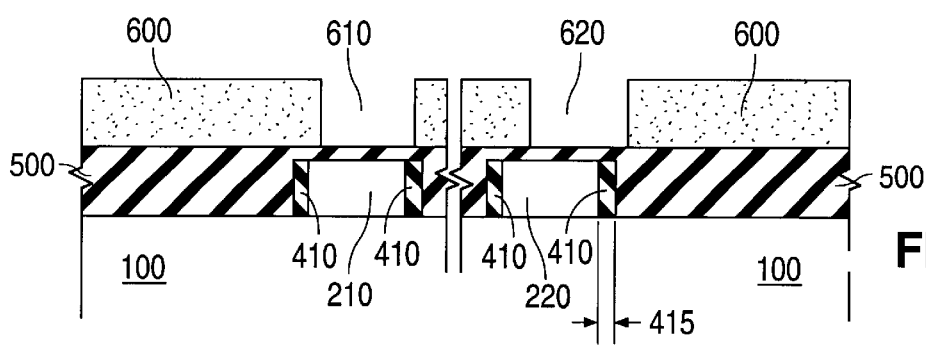

Turning now to FIG. 2D, as previously mentioned, a first and second portion of the embodiment of FIG. 2C, in accordance with the present invention, is shown. In each portion, a dielectric layer 500 is formed overlying each conductive trace 210 and 220, respectively, and underlying substrate 100. In some embodiments, one of the commonly known planarization processes is employed to planarize layer 500, as is depicted. For example, in some embodiments layer 500 is planarized using a chemical mechanical planarization (CMP) process, while in some embodiments a sacrificial layer/etch-back process is employed.

A masking layer 600 is disposed on layer 500 and a first contact area 610 is formed in layer 600 to expose a portion of layer 500 overlying a portion of conductive trace 210 and a portion of one process buffering area 410. Thus contact area 610 is shown aligned to trace 210 in a manner analogous to the alignment of contact 40 to trace 30 depicted in FIG. 1A. In the second portion of the embodiment of FIG. 2D, a second contact area 620 is formed in layer 600 to expose another portion of layer 500 overlying a portion of conductive trace 220, a portion of one process buffering area 410 and extending to expose some of layer 500 beyond that process buffering area 410. The alignment of contact area 620 is in a manner analogous to the alignment of contact 42 to trace 32 depicted in FIG. 1B. It will be understood that the alignment of areas 610 and 620 are shown in the manner of the alignment of contact 40 and 42 for illustrative purposes only. Thus these depictions of FIG. 2D serve to highlight, as will be discussed, the advantages of embodiments of the present invention as compared to the previously illustrated prior art structures.

Figure 1A:
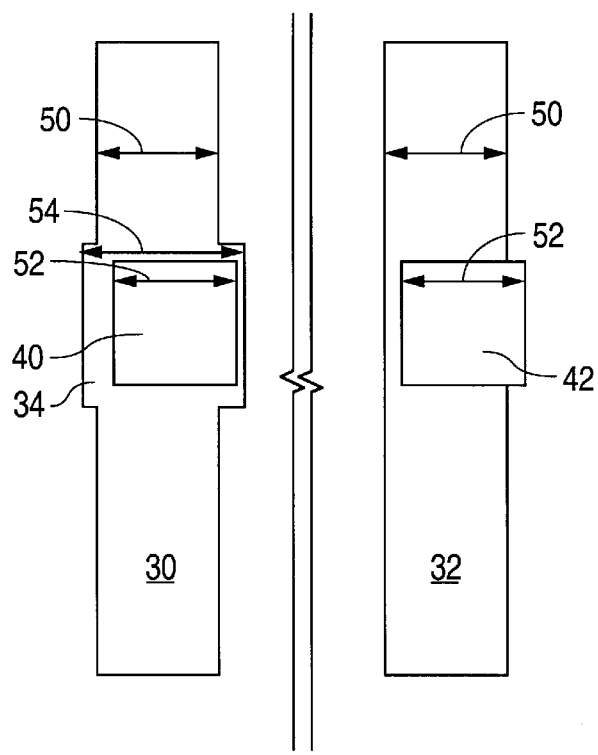
FIGS. 1A and 1B are plan views of conductive traces and contact regions formed in the manner of the prior art.
Figure 2E:
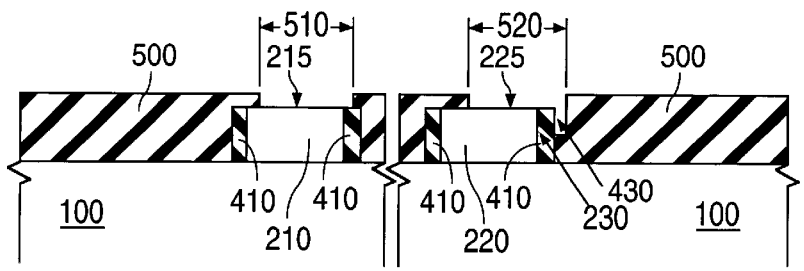

FIG. 2E is a cross-sectional view of the embodiments of FIG. 2D subsequent to etching layer 500 to form a first contact opening 510, a second contact opening 520 and removal of masking layer 600. As depicted, first contact opening 510 exposes surface 215 of conductive trace 210. In addition, a portion of process buffering area 410 adjacent trace 210 is exposed. Thus the slight mis-alignment of contact area 610 (FIG. 2D) is accommodated by process buffering spacer 410 and no expanded contact region as seen in FIG. 1A is required. Second contact 520 exposes surface 225 of conductive trace 220, a portion of buffering spacer 410 and an edge 430 of buffering spacer 410. Thus, it will be understood that process buffering spacer 410 advantageously protects edge 230 of conductive trace 220 from being exposed, despite the misalignment of contact 520.

As known for the prior art structure of FIG. 1B, where contact 42 is formed over an aluminum (Al) trace 32, any exposed edge of Al trace 32 can lead to the formation of aluminum fluoride ($AlF_3$) and/or "volcano" defects where a tungsten (W) plug (not shown) is formed to subsequently fill contact 42. For embodiments of the present invention, edge 230 is not exposed, but rather protected by buffering spacer 410. Thus embodiments in accordance with the present invention advantageously provide protection against such yield and reliability as $AlF_3$ and "volcano" defects.

In addition, where trace 220 is a polysilicon material, often a metal silicide is formed at surface 225 to enhance electrical coupling by lowering the resistance of the surface. If, similar to what occurs with contact opening 42 to trace 32 in FIG. 1B, edge 230 were exposed during a silicide process, metal silicide (not shown) could undesirably form at edge 230 providing for unplanned and therefore undesirable electrical coupling to other closely spaced conductive regions (not shown). However, right-hand buffering spacer 410 covers edge 230 and thereby prevents it from being exposed. Therefore, embodiments in accordance with the present invention advantageously provide protection against such undesirable couplings.

Figure 1B:
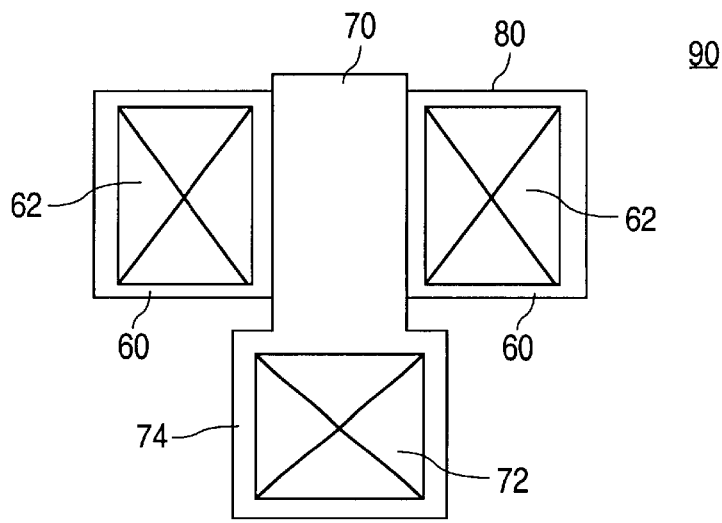

It will also be understood, that the advantages of embodiments of the present invention, as described herein, are provided without use of expanded contact areas or extended contact areas as described with regard to the prior art (See FIGS. 1A and 1B). Therefore, embodiments in accordance with the present invention do not require the additional area required by these prior art contact areas, and minimized contact areas are provided.

Figure 3A:
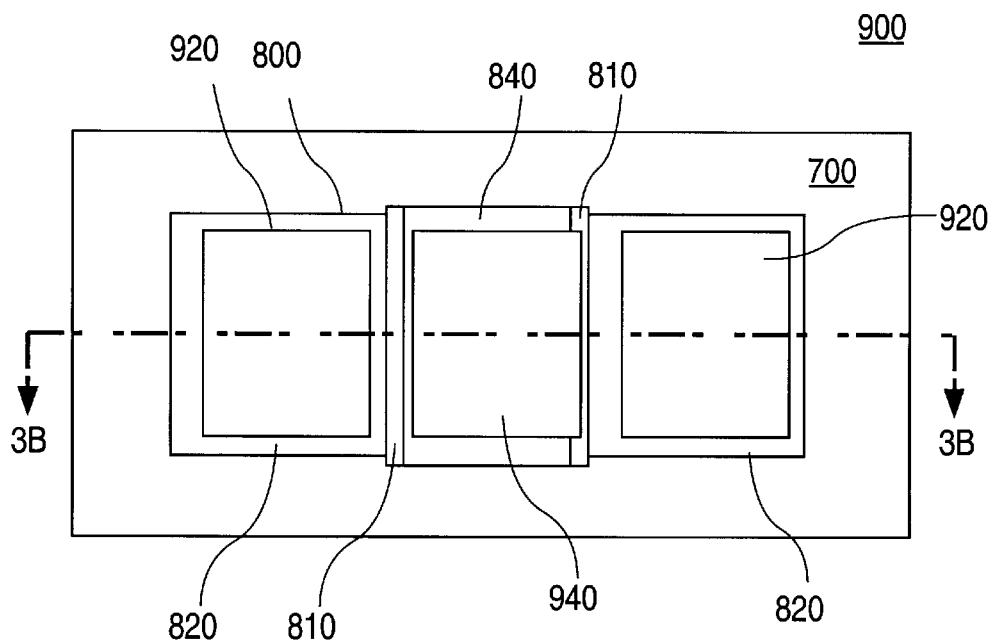
FIGS. 3A–3B are a plan and cross-sectional representation, respectively, of contact regions on a gate electrode in accordance with another embodiment of the present invention.

Turning now to FIG. 3A, a plan view of an MOS transistor 900 formed in accordance with an embodiment of the present invention is depicted. An active area 800 is defined by an isolation region 700 and has S/D regions 820 formed therein. The nature of the embodiments of the present invention make them applicable to any type of transistor. Thus the benefits and advantages of the present invention are equally applicable to an NPN or a PNP transistor 900. In addition, the benefits and advantages of the present invention are equally applicable to MOS transistors formed having silicon gates or metal gates. In addition, as the characteristics of S/D regions 820, isolation region 700 and other transistor structures depicted in FIGS. 3A and 3B are well known and additionally encompass well known and commonly practiced methods, for simplicity and ease of understanding, descriptions of these characteristics and methods will be omitted.

A gate electrode 840 is disposed adjacent to and between S/D regions 820 and overlying a channel region (not shown) defined by S/D regions 820 in active area 800. While gate electrode 840 is typically formed from a polysilicon material, other appropriate materials can be used. For example, gate electrode 840 can be formed using amorphous silicon which is converted in-situ to polysilicon in a manner known to one of ordinary skill in the art. In addition, in some embodiments in accordance with the present invention, gate electrode 840 is a metal such as tungsten (W), molybdenum (Mo) or tantalum (Ta). For example, in some embodiments a W gate electrode 840 is advantageously used. Alternatively, in some embodiments it is advantageous to employ a Mo or Ta gate electrode 840.

Gate process buffering areas 810 are depicted adjacent edges of gate electrode 840. Buffering areas 810 are formed of any of the materials, and in the manner described with respect to FIGS. 2B and 2C. S/D contact openings 920 are formed overlying and laterally within S/D regions 820. Gate contact opening 940 and S/D contact openings 920 are formed in a dielectric layer not visible in the plan view of FIG. 3A. It will be understood, that as transistor 900 is formed in accordance with embodiments of the present invention, no extended contact area as seen in FIG. 1B is needed.

Figure 3B:
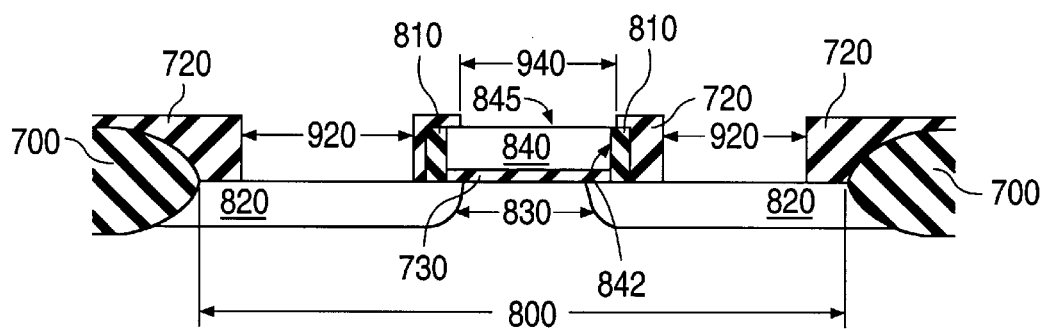

FIG. 3B is a cross-sectional view of transistor 900 of FIG. 3A taken through section line 3B—3B in FIG. 3A. Thus active area 800 is shown defined by isolation region 700. Gate electrode 840 with adjacent gate buffering areas 810 is shown overlying a gate dielectric 730 and channel region 830 which in turn is seen to be adjacent S/D regions 820. In embodiments of the present invention employing a silicon gate electrode 840, gate dielectric 730 is typically formed of a silicon oxide material, although other appropriate materials can be used. In embodiments where gate electrode 840 is a metal material, for example tungsten (W), a $Ta_2O_5$ gate dielectric layer 730 can be advantageously used. In some embodiments employing a Mo or Ta gate electrode 840 a silicon oxide gate dielectric layer 730 having an intervening barrier layer such as titanium/titanium nitride (not shown) is employed. The cross-sectional view of FIG. 3A illustrates the formation of gate contact 940 and S/D contacts 920 in dielectric layer 720 as previously mentioned. In addition, process buffering areas 810 are formed of materials and by the methods previously described for embodiments of buffering areas 410 with regard to FIGS. 2B and 2C. Therefore, these materials and methods are understood to be applicable to the formation of gate process buffering areas or spacers 810 as well.

In a manner analogous to the first portion of FIG. 2E, it is seen that gate contact 940 is formed exposing surface 845 of gate electrode 840. In embodiments of the present invention where gate electrode 840 encompasses a silicon material, it is advantageous to form a metal silicide contact region (not shown) at surface 845. Such a metal silicide region serves to lower the contact resistance to gate electrode 840. While in accordance with the present invention, any of the well known processes for forming such metal silicide regions can be employed, it is a particular benefit of the present invention that process buffering regions 810 limit any metal silicide formation to surface 845. Thus gate electrode edge 842 is free of such metal silicide formation. In embodiments of the present invention where gate electrode 840 encompasses a metal material, no metal silicide region is formed at surface 845.

It will also be understood, that the advantages of embodiments of the present invention previously described with respect to FIG. 2E are also provided by the embodiment of FIGS. 3A and 3B. Thus it will be realized that embodiments of the present invention have been described that provide for semiconductor integrated circuits, and methods thereof, that employ minimized area contacts. In addition, it will be realized that embodiments in accordance with the present invention do not require the additional area required by these prior art expanded or extended contact areas. Additionally, it will realized that the embodiments of the present invention described herein do not require any photolithographic processing for their benefits to be realized. It will also be realized that embodiments of the present invention are broadly applicable to a wide range of semiconductor structures and devices and that, while only an MOS transistor has been specifically described, the process buffering provided by these embodiments is applicable to MOS ICs as well as bipolar ICs and ICs that combine MOS and bipolar device structures. For example, process buffering areas analogous to those previously described herein can be utilized to form minimized area contacts to bipolar base, collector or emitter regions. Thus, the method of formation and structure of process buffering areas for the polysilicon emitter region of a bipolar transistor are readily determined from the descriptions herein. It will also be realized that embodiments of the present invention provide protection to sidewalls of conductive traces, for example gate electrodes. Thus where metal silicide regions are formed, this protection serves to prevent formation of metal silicide on such sidewalls. Finally, it will be realized that embodiments of the present invention are cost effective structures that offer yield and reliability enhancement.

I claim:

1. A semiconductor device, comprising:

a semiconductor wafer;

a gate electrode overlying said semiconductor wafer and having a width defined by essentially parallel, opposing sidewalls;

a dielectric spacer adjacent each of said opposing sidewalls, said dielectric spacers having an elevation approximately equal to that of the adjacent gate electrode sidewall;

an insulating layer overlying said semiconductor wafer, said gate electrode and said spacers;

a gate electrode contact opening having a dimension parallel to said width, wherein said gate electrode contact opening is disposed overlying a portion of said gate electrode and a portion of at least one of said spacers, and wherein said dimension is essentially equal to said width;

at least one doped region formed in said semiconductor wafer extending into said semiconductor wafer to a uniform depth and extending under said gate electrode, wherein said insulating layer defines a contact opening to said doped region at a surface of said semiconductor wafer.

2. The semiconductor device of claim 1, wherein said spacers comprise silicon dioxide.

3. The semiconductor device of claim 1, wherein said spacers comprise silicon nitride.

4. The semiconductor device of claim 1, wherein said spacers comprise a layer of silicon nitride and a layer of silicon dioxide.

5. The semiconductor device of claim 1, wherein said gate electrode comprises a conductive material selected from the group consisting of tungsten, tantalum, molybdenum, polysilicon, amorphous silicon, and combinations thereof.

* * * * *